United States Patent
Huang

(10) Patent No.: US 8,207,862 B2
(45) Date of Patent: Jun. 26, 2012

(54) UNDER-VOLTAGE WARNING CIRCUIT

(75) Inventor: Yong-Zhao Huang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 480 days.

(21) Appl. No.: 12/545,086

(22) Filed: Aug. 21, 2009

(65) Prior Publication Data

US 2011/0025518 A1    Feb. 3, 2011

(51) Int. Cl.
  *G08B 21/00*  (2006.01)
  *H02H 3/24*  (2006.01)
(52) U.S. Cl. .............. 340/663; 340/636.15; 361/92
(58) Field of Classification Search .............. 340/663, 340/660–662, 636.15, 636.19; 361/92, 88; 320/135, 136; 324/103 R, 103 P
See application file for complete search history.

(56) References Cited

U.S. PATENT DOCUMENTS

| | | | | |
|---|---|---|---|---|
| 3,343,036 A | * | 9/1967 | Steen | 361/92 |
| 3,576,488 A | * | 4/1971 | Zug et al. | 340/636.15 |
| 3,733,595 A | * | 5/1973 | Benedict | 340/527 |
| 3,774,109 A | * | 11/1973 | Janycky | 324/103 P |
| 4,126,889 A | * | 11/1978 | Ibamoto et al. | 361/92 |
| 4,139,846 A | * | 2/1979 | Conforti | 340/636.15 |
| 4,491,971 A | * | 1/1985 | Webb et al. | 455/100 |
| 4,675,776 A | * | 6/1987 | Howell | 361/92 |
| 2010/0259196 A1 | * | 10/2010 | Sadwick et al. | 315/309 |

OTHER PUBLICATIONS

JP-11-160370; Kawasaki Suketsugu; Oki Electric Ind Co Ltd; Jun. 1999; Abstract.*

* cited by examiner

*Primary Examiner* — George Bugg
*Assistant Examiner* — Anne Lai
(74) *Attorney, Agent, or Firm* — Altis Law Group, Inc.

(57) ABSTRACT

An under-voltage warning circuit includes a Zener diode, a transistor, an annunciator, and a thyristor. When the power source is within a certain range, the annunciator does not work. When the voltage level of the power source V_in is lower than the predetermined value, the annunciator works to denote that the power source is under-voltage.

4 Claims, 2 Drawing Sheets

UNDER-VOLTAGE WARNING CIRCUIT

BACKGROUND

1. Technical Field

The present disclosure relates to voltage warning circuits and, particularly, to an under-voltage warning circuit.

2. Description of Related Art

Nowadays, electronic devices usually include both over-voltage detecting circuits and under-voltage detecting circuits. When the voltage from a power source of an electronic device is over-voltage or under-voltage, a detecting circuit of the electronic device will disconnect the power source to protect the electronic device. However, operators often do not know whether the power source is under-voltage or over-voltage when the power source is disconnected.

DETAILED DESCRIPTION

Figure 1:
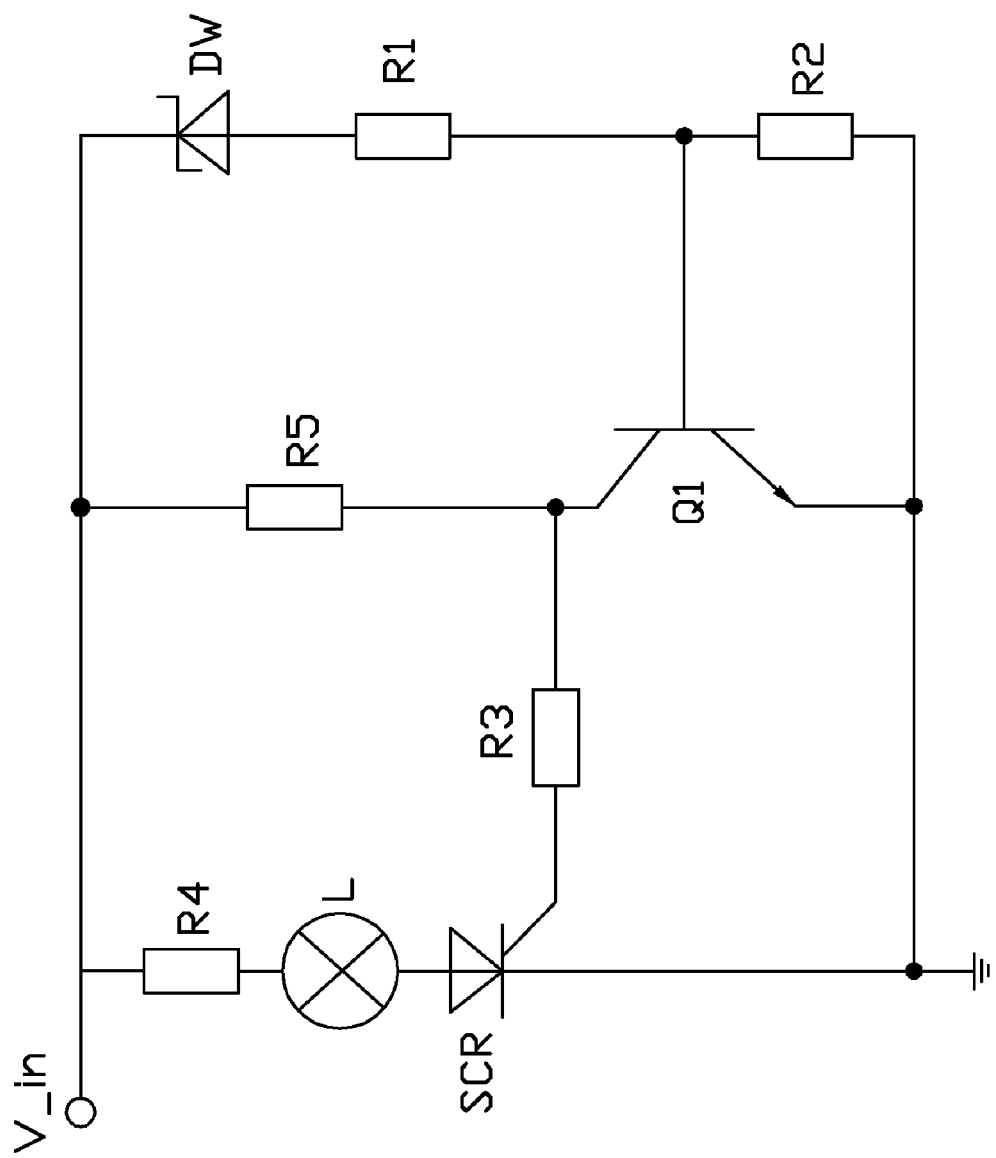
FIG. 1 is a circuit diagram of a first exemplary embodiment of an under-voltage warning circuit.

Referring to FIG. 1, a first exemplary embodiment of an under-voltage warning circuit includes a transistor Q1, a thyristor SCR, a light emitting diode L, a Zener diode DW, four resistors R1, R2, R3, R4, and a pull-up resistor R5.

A collector of the transistor Q1 is connected to a power source V_in via the pull-up resistor R5. A base of the transistor Q1 is connected to an anode of the Zener diode DW via the resistor R1. An emitter of the transistor Q1 is grounded. The base of the transistor Q1 is also grounded via the resistor R2.

An anode of the thyristor SCR is connected to the power source V_in via the light emitting diode L and the resistor R4 in series. A cathode of the thyristor SCR is grounded. A control terminal of the thyristor SCR is connected to the collector of the transistor Q1 via the resistor R3.

Upon the condition that a voltage level of the power source V_in is within a certain range, the transistor Q1 is turned on. The collector of the transistor Q1 is grounded. As a result, the thyristor SCR is turned off because of the control terminal of the thyristor SCR being at low level. The light emitting diode L is not lit.

Upon the condition that a voltage level of the power source V_in is lower than a predetermined value, the transistor Q1 is turned off. The collector of the transistor Q1 is at a high level. As a result, the thyristor SCR is turned on because of the control terminal of the thyristor SCR being at high level. The light emitting diode L is lit.

Figure 2:
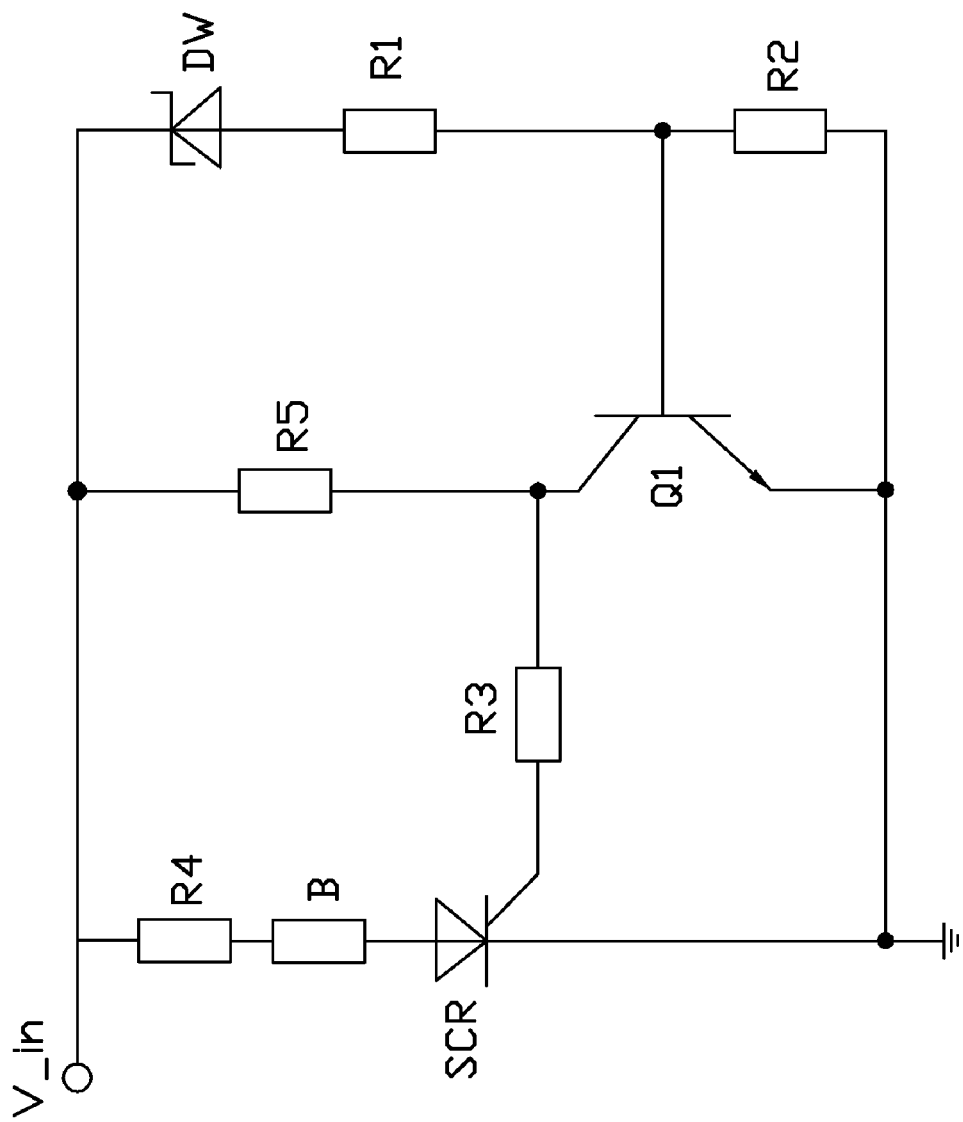
FIG. 2 is a circuit diagram of a second exemplary embodiment of an under-voltage warning circuit.

Referring to FIG. 2, a difference of a second exemplary embodiment from the first exemplary embodiment is that another annunciator, such as a buzzer B replaces the light emitting diode L of the first exemplary embodiment.

Upon the condition that the voltage level of the power source V_in is within the certain range, the buzzer B is silent. Upon the condition that the voltage level of the power source V_in is lower than the predetermined value, the buzzer B is audible.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. An under-voltage warning circuit for detecting a power source, comprising:
   a Zener diode, wherein a cathode of the Zener diode is connected to the power source;
   a transistor, wherein a collector of the transistor is connected to the power source via a pull-up resistor, a base of the transistor is connected to an anode of the Zener diode via a first resistor, an emitter of the transistor is grounded;
   an annunciator; and
   a thyristor, wherein an anode of the thyristor is connected to the power source via the annunciator and a second resistor, a control terminal of the thyristor is connected to the collector of the transistor via a third resistor, a cathode of the thyristor is grounded.

2. The under-voltage warning circuit of claim 1, wherein the base of the transistor is grounded via a fourth resistor.

3. The under-voltage warning circuit of claim 1, wherein the annunciator is a light emitting diode.

4. The under-voltage warning circuit of claim 1, wherein the annunciator is a buzzer.

* * * * *